US006073723A

United States Patent [19]

Gallo

[11] Patent Number: 6,073,723

[45] Date of Patent: Jun. 13, 2000

[54] ACOUSTIC DAMPING MATERIAL

[76] Inventor: Anthony Gallo, 1684 W. 2nd St., Brooklyn, N.Y. 11223-1608

[21] Appl. No.: 09/092,616

[22] Filed: Jun. 5, 1998

[51] Int. Cl.[7] .......... H05K 5/00

[52] U.S. Cl. .......... 181/151; 181/146; 181/199

[58] Field of Search .......... 181/146, 151, 181/153, 199, 207, 208

[56] References Cited

U.S. PATENT DOCUMENTS

| | | | |
|---|---|---|---|
| 2,941,911 | 6/1960 | Kumnick et al. | 181/208 |
| 3,386,527 | 6/1968 | Daubert et al. | 181/208 |
| 3,592,290 | 7/1971 | Armstrong | 181/151 |
| 4,044,855 | 8/1977 | Kobayashi | 181/151 |
| 4,101,736 | 7/1978 | Czerwinski | 181/151 |
| 4,439,644 | 3/1984 | Bruney, III | 181/199 |
| 4,485,275 | 11/1984 | Lahti . | |

FOREIGN PATENT DOCUMENTS

| | | |
|---|---|---|
| 2 372 566 | 6/1975 | France . |
| 3317273 | 11/1983 | Germany . |
| 3733284 | 4/1989 | Germany . |
| 03159738 | 7/1991 | Japan . |
| 03180340 | 8/1991 | Japan . |
| 10061057 | 3/1998 | Japan . |

*Primary Examiner*—Khanh Dang
*Attorney, Agent, or Firm*—Fish & Neave; Jeffrey H. Ingerman; Brett G. Alten

[57] ABSTRACT

An acoustic damping material that includes at least one resilient sheet, wherein each of the sheets have a first side and a second side, and wherein at least two portions of the sides face each other to form a multi-layered structure, is provided. The resilient sheet may be made from any resilient polymer film, such as a polyolefin, and especially polyethylene. Also provided is an acoustic speaker system that has an exceptionally flat frequency response, especially at low audible frequencies. The system includes an enclosure, a speaker mounted to the enclosure, and acoustic damping material (according to this invention) inside the enclosure. An acoustic damping panel, which includes a frame and acoustic damping material fixed to the frame, is also provided.

58 Claims, 5 Drawing Sheets

ACOUSTIC DAMPING MATERIAL

BACKGROUND OF THE INVENTION

This invention relates to acoustic damping material. More particularly, this invention relates to acoustic damping material for use in various acoustic devices, such as acoustic speaker systems and acoustic damping panels.

Acoustic speaker systems generally include at least one acoustic speaker mounted to a speaker enclosure. The speaker converts electric energy into acoustic energy over a particular frequency range. The conversion of electric energy into acoustic energy is limited by the mechanical constraints of the speaker and its enclosure. For example, in conventional electromagnetic speakers, an electric current energizes an electromagnet that is fixed to a lightweight flexible surface, producing an electromagnetic field. This field interacts with another magnetic field produced by a permanent magnet fixed to a frame holding the flexible surface. During operation, the interaction between the fields produces a force which drives the surface to vibrate at the frequency of the electric signal, thereby producing acoustic energy.

An important disadvantage of acoustic speaker system enclosures is the large physical size required to ensure a balanced and efficient low frequency response. The primary reason for using a large enclosure is to provide a sufficient volume of air against which a woofer can freely vibrate. Small enclosures, however, contain small volumes of air which restrict the vibratory motion of the woofer. Acoustic dampening materials such as fiberglass, wool, and synthetic polyester fibers (such as those sold under the trademark DACRON®, by E. I. du Pont de Nemours & Company, of Wilmington, Del.), are often used to diminish the enclosure size requirement. Unfortunately, however, because of these materials' low acoustic absorption, the use of these materials can not substantially reduce the size of the enclosure and simultaneously ensure a balanced low frequency response.

Furthermore, because conventional acoustic damping materials do not efficiently absorb the acoustic energy during speaker operation, the enclosure absorbs it, and subsequently releases it in the form of acoustic energy at different undesired frequencies, including, possibly, undesirable harmonics of desirable acoustic frequencies.

Acoustic damping materials can also be useful for absorbing sound in substantially enclosed spaces, such as sound recording rooms and areas that are subject to undesirable noise. One method for absorbing sound includes mounting acoustic damping panels on one or more walls of the enclosed space. However, a disadvantage of conventional acoustic damping materials, which are often made from foamed materials, is that such materials are generally expensive and relatively inefficient.

It would therefore be desirable to be able to provide an acoustic damping material that can be used whenever acoustic energy is desirably absorbed.

It would also be desirable to provide an acoustic speaker system that is physically small and produces a broad balanced response over the entire audible spectrum, especially at low frequencies.

It would further be desirable to be able to provide an acoustic damping material that efficiently absorbs acoustic energy for improving the accuracy of the acoustic reproduction of electric signals of an acoustic speaker system.

It would be even further desirable to be able to provide an inexpensive, yet highly efficient, acoustic damping panel for absorbing acoustic energy in substantially enclosed spaces.

SUMMARY OF THE INVENTION

It is an object of this invention to provide an acoustic damping material that can be used whenever acoustic energy is desirably absorbed.

It is also an object of this invention to provide a speaker system that is physically small and produces a broad balanced response over the entire audible spectrum, especially at low frequencies.

It is a further object of this invention to provide an acoustic damping material that efficiently absorbs acoustic energy for improving the accuracy of the acoustic reproduction of electric signals of an acoustic speaker system.

It is yet a further object of this invention to provide an inexpensive, yet highly efficient, acoustic damping panel for absorbing acoustic energy in substantially enclosed spaces.

In accordance with this invention, there is provided an acoustic damping material, which includes at least one resilient sheet. Each sheet has a first side and a second side. At least a first portion of one of the first and second sides and a second portion of one of the first and second sides face each other to form a multi-layered structure. The resilient sheet may be any resilient polymer film, such as a polyolefin, and more particularly polyethylene. The sheet preferably has a thickness of less than about 5 mils (about 0.13 mm), and most preferably has a thickness of less than about 1.5 mils (about 0.038 mm).

The acoustic damping material of this invention may be used to make an acoustic speaker system with an exceptionally flat frequency response. An acoustic speaker system according to this invention at least includes a system enclosure, an acoustic speaker mounted to the enclosure, and acoustic damping material (according to this invention) inside the enclosure.

The acoustic damping material of this invention may also be used to make an acoustic damping panel. The panel includes a frame and acoustic damping material fixed to the frame. The acoustic damping material again includes at least one resilient sheet arranged in a multi-layered fashion.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
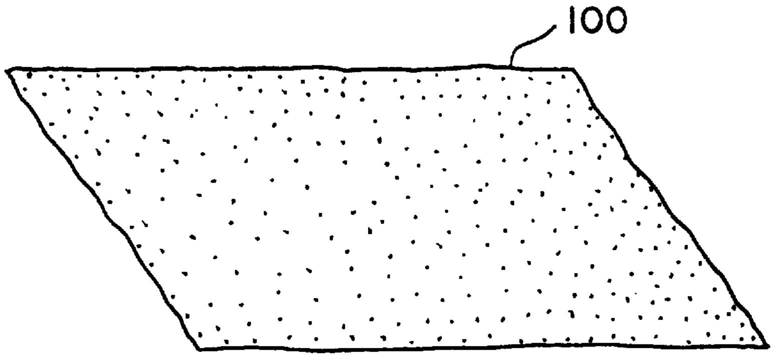
FIG. 1 is a perspective view of a resilient sheet that can be made into acoustic damping material according to this invention.

The present invention is directed to an acoustic damping material. When used in an acoustic speaker system, the material provides an exceptionally flat frequency response, especially at low frequencies.

The acoustic damping material of this invention is made from at least one resilient sheet, which is preferably arranged to form a multi-layered acoustic damping structure. The resilient sheet is preferably made from any substantially resilient polymer film, which may include one or more copolymers. One polymer that can be used is a polyolefin. Preferably, the polyolefin is polyethylene. The sheet preferably has a thickness of less than about 5 mils (about 0.13 mm), and most preferably has a thickness of less than about 1.5 mils (about 0.038 mm).

The resilient sheet has a first side and a second side. At least a first portion of one of said first and second sides and a second portion of one of said first and said second sides face each other to form a multi-layered structure.

There are various ways that one or more sheets may be deformed to create a multi-layered structure. For example, a sheet may be folded, rolled, twisted, or simply crushed with no particular regularity. Also, two or more sheets may be rolled, folded, or twisted together if desired. However, regardless of the method used, pockets, or strata, of a compressible material (e.g., air) may be located between adjacent layers.

Resilient multi-layered structures have been shown to have unusually high acoustic opacity. The high acoustic opacity of these multi-layered structures is believed to result from a combination of the high compressibility of the air pockets and the resilient nature of the individual sheets. Also, the acoustic opacity of the material is improved when a large number of layers is used and when those layers are oriented substantially perpendicular to the acoustic waves being blocked.

It will be appreciated that the sheets used to make the acoustic damping material of this invention are entirely different from known fibrous acoustic damping materials. Sheets may form flexible barriers that may force incident air in a direction that preferably are substantially perpendicular to the direction of the incident sound wave. Although fibers, to some degree, also redirect sound waves, fibers do not form highly flexible barriers to the passage of sound waves.

The acoustic damping material of this invention may be used to make an acoustic speaker system with an exceptionally flat frequency response, especially at low frequencies. Such a system includes a system enclosure, an acoustic speaker mounted to the enclosure, and acoustic damping material (made according to this invention) inside the enclosure. Any number of acoustic damping structures can be used inside the enclosure. Preferably, the acoustic damping material is deformed to have a cavity that is adapted to receive the rear side of the speaker.

In addition to acoustic speaker systems, the acoustic damping material made according to this invention can be used to make other types of acoustic damping structures, such as acoustic damping panels. An acoustic damping panel at least includes a frame and acoustic damping material according to this invention that is fixed to the frame. The surface area of the panel may be increased by constructing a frame that is not flat.

The invention will now be described with reference to FIGS. 1–17.

FIG. 1 shows resilient sheet 100 that may be used to make an acoustic damping material in accordance with this invention. Sheet 100 is preferably deformed as described below to create a multi-layered acoustic damping structure. Alternatively, two or more sheets may be used together to create a multi-layered structure in accordance with this invention.

Resilient sheets are preferably made from any substantially resilient polymer, which may include one or more copolymers. One type of polymer that can be used in accordance with this invention is a polyolefin. Preferably, the polyolefin is polyethylene. A single sheet can have a substantially uniform composition, but can also be a laminate—i.e., a plurality of substantially parallel layers whose adjacent surfaces are substantially bonded together. A resilient sheet used to make the acoustic damping material according to this invention preferably has a thickness of less than about 5 mils (about 0.13 mm), and most preferably has a thickness of less than about 1.5 mils (about 0.038 mm). A resilient sheet used to make the acoustic damping material according to this invention may be substantially nonporous to air at about atmospheric pressure (i.e., about 1 atm (about 101.3 kPa)).

Examples of resilient sheets include plastic wraps sold under the trademarks Handi-Wrap®, by DowBrands L. P., of Indianapolis, Ind. and Franklin Wrap™, by Franklin Industries, L.L.C., of Brooklyn, N.Y. Other examples include Clear Food Wrap, by Pathmark Stores, Inc., of Woodbridge, N.J., Saran Wrap, by DowBrands L.P., Indianapolis, Ind., Reynolds® Plastic Wrap, by Reynolds Metals Company, of Richmond, Va., and Glad® Cling Wrap, by First Brands Corporation, of Danbury, Conn.

Resilient sheet 100 has two sides. Acoustic damping material according to this invention can include one or more sheets, each of which have a first side and a second side. At least a first portion of one of the first and second sides and a second portion of one of the first and second sides face each other to form a multi-layered structure. For example, this means that different portions of (1) one side of one sheet, (2) opposite sides of one sheet, or (3) sides of two different sheets, may face each other. Preferably, single sheet 100 is deformed into a multi-layered structure.

Figure 3:
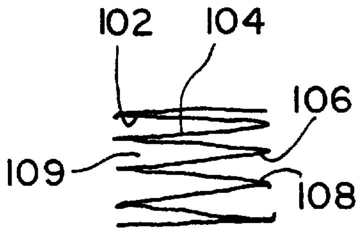
FIG. 3 is a cross-sectional view, taken from line 3—3 of FIG. 2, of the folded acoustic damping structure of FIG. 2.
Figure 2:
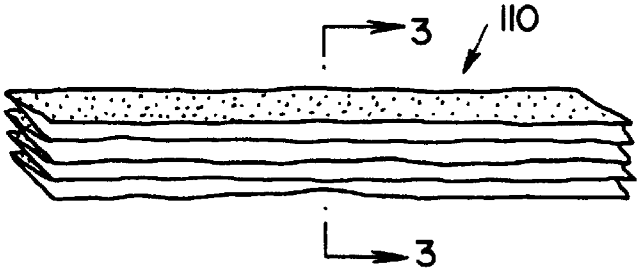
FIG. 2 is a perspective view of an illustrative embodiment according to this invention of a folded acoustic damping structure made from the resilient sheet shown in FIG. 1.

FIG. 2 shows one embodiment of this invention in which sheet 100 is folded to produce folded structure 110. As best shown in FIG. 3, which is a cross-sectional view of structure 110, portions 102 and 104 (both of which are portions of a first side of sheet 100), as well as 116 and 118 (both of which are portion of a second side of sheet 100), face each other. In this embodiment, both portions in any one pair of facing portions are from the same side of sheet 100, with alternating pairs being from different sides of sheet 100.

Figure 5:
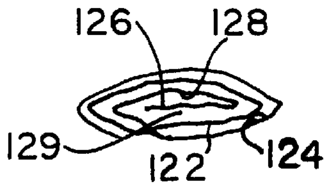
FIG. 5 is a cross-sectional view, taken from line 5—5 of FIG. 4, of the folded roll, acoustic damping structure of FIG. 4.
Figure 4:
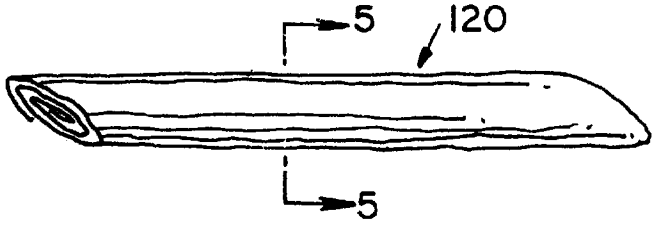
FIG. 4 is a perspective view of an illustrative embodiment according to this invention of a folded roll, acoustic damping structure made from the resilient sheet shown in FIG. 1.

There are various other ways that sheet 100 can be used to make an acoustic damping material according to this invention. A first way includes repeatedly folding sheet 100 to produce flattened roll structure 120, shown in FIG. 4. FIG. 5 shows a cross-sectional view of structure 120, including particularly portions 122 and 124 (both of which are portions of one side of sheet 100), which face each other, as well as portions 126 and 128 (each of which is a portion of a different side of sheet 100), which also face each other. For the most part, except for the internal fold where portions 122, 124 of the same side of sheet 100 face each other, on this embodiment every pair of facing portions includes one portion from each side of sheet 100. Air 109, or any other highly compressible material, may be located between the facing portions.

Figure 7:
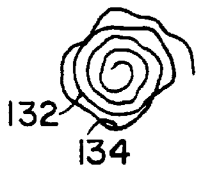
FIG. 7 is a cross-sectional view, taken from line 7—7 of FIG. 6, of the rolled acoustic damping structure of FIG. 6.
Figure 6:
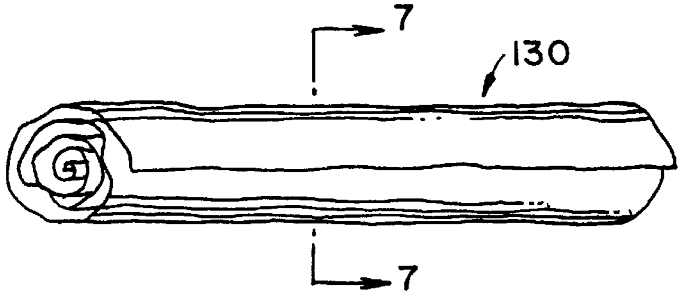
FIG. 6 is a perspective view of an illustrative embodiment according to this invention of a rolled acoustic damping structure made from the resilient sheet shown in FIG. 1.
Figure 9:
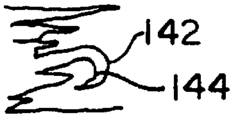
FIG. 9 is a cross-sectional view, taken from line 9—9 of FIG. 8, of the hybrid acoustic damping structure of FIG. 8.

A second way that sheet 100 can be deformed includes simply rolling it into roll 130, which is shown in FIG. 6. FIG. 7 shows a cross-sectional view of roll 130, including particularly portions 132 and 134 (each of which is a portion of a different side of sheet 100), which also face each other. In this embodiment, except for the very center of the roll, every pair of facing portions includes one portion from each side of sheet 100. Again, air 129, or any other compressible material (e.g., gas), may substantially fill the space between facing portions.

Figure 8:
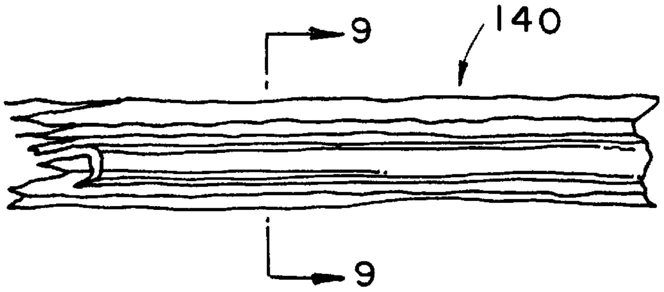
FIG. 8 is a perspective view of an illustrative embodiment according to this invention of a hybrid acoustic damping structure made from the resilient sheet shown in FIG. 1.
Figure 11:
FIG. 11 is a cross-sectional view, taken from line 11—11 of FIG. 10, of the twisted acoustic damping structure of FIG. 10.
Figure 10:
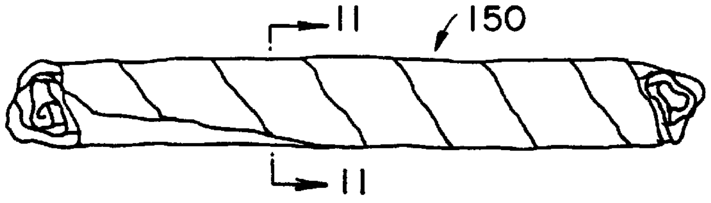
FIG. 10 is a perspective view of an illustrative embodiment according to this invention of a twisted acoustic damping structure made from the resilient sheet shown in FIG. 1.

A third way that sheet 100 can be deformed includes both folding and rolling it to create hybrid structure 140, as shown in FIG. 8. Structure 140 includes adjacent layers that face each other (see, e.g., FIG. 9, portions 142 and 144), which are substantially separated by layers of a compressible material (even though facing portions may be in physical contact). In this embodiment, there is a mixture of (1) pairs of facing portions in which each portion is from the same side of sheet 100, and (2) pairs of facing portions in which one facing portion is from each side of sheet 100. Acoustic damping material according to any of the embodiments shown in FIGS. 1–11 can also be deformed by twisting one or more sheets into twisted structure 150, as shown in FIGS. 10 and 11.

It will be appreciated that multiple sheets may be used in any number of ways to form multi-layered structures. For example, although structure 130 is formed by rolling a single sheet, it will be appreciated that two or more sheets may be rolled together if desired. Also, as described above, regardless of the method used to form the multi-layered structure, pockets of air (or any other compressible material) are substantially trapped between the layers. It should be noted, however, that at least some of the pockets are preferably in fluid communication with one another so that the air can travel therebetween. Furthermore, the pockets may be in fluid communication with the atmosphere through one or more ports in the enclosure.

While not wishing to be bound by any particular theory, the unusually high acoustic opacity of these multi-layered structures is believed to result from a combination of the high compressibility of the air pockets and the highly resilient nature of the individual layers. Accordingly, it is believed that the air pressure between the layers should not be substantially different from the atmospheric pressure during operation of the acoustic damping material. When the air pressure between adjacent layers (i.e., in the pockets) is substantially different from atmospheric pressure, that difference may increase the acoustic coupling between adjacent layers, which in turn may decrease the acoustic damping efficiency of the material. Also, the acoustic opacity of the material is improved when a large number of layers, each of which may be formed from the same or different sheets, is used and when those layers are oriented substantially perpendicular to the acoustic waves being blocked.

The acoustic damping material of this invention may be used to make an acoustic speaker system with an exceptionally flat frequency response, especially at low frequencies. An acoustic speaker system constructed according to this invention also exhibits excellent dynamic response, including a 20% improvement in attack rate and a 30% improvement in decay rate over similar speaker systems using conventional acoustic damping material.

An acoustic speaker system according to this invention includes a system enclosure, an acoustic speaker mounted to the enclosure, and acoustic damping material made according to this invention inside the enclosure. The acoustic damping material used in this system is the same as described above. Additional acoustic components, such as enclosure ports for providing fluid communication between the acoustic damping material and the atmosphere and additional acoustic speakers, may also be added to the acoustic speaker system as desired.

Figure 12:
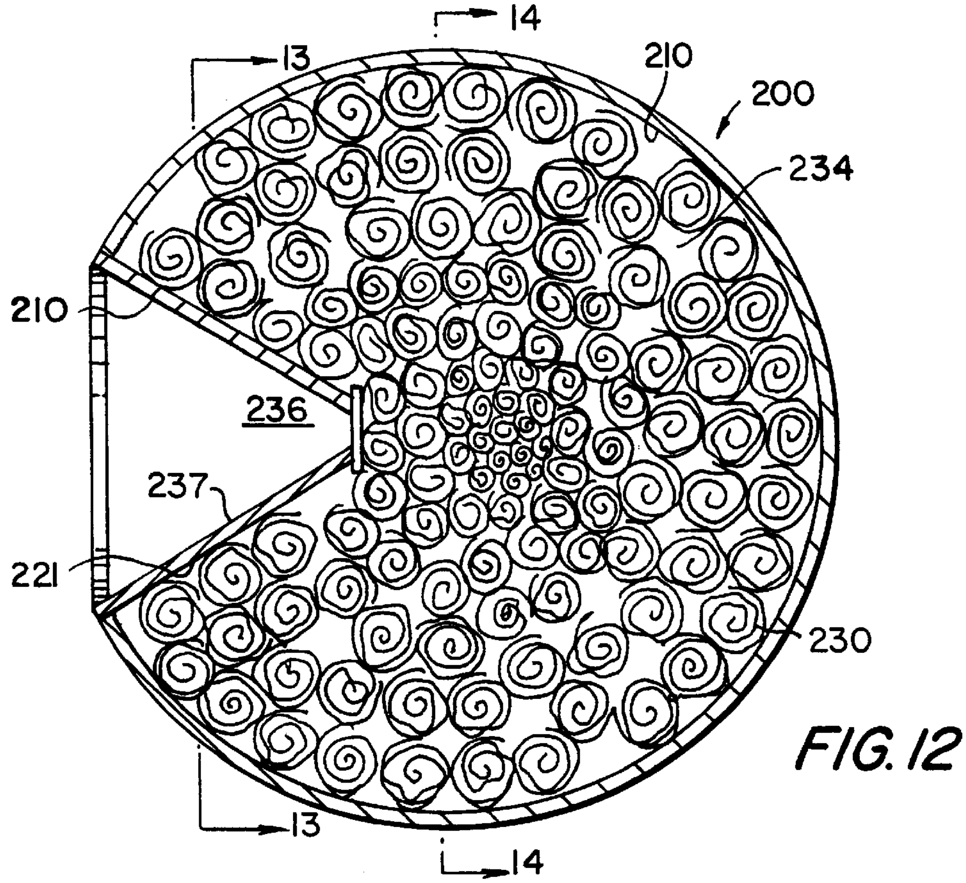
FIG. 12 is a cross-sectional view of a first preferred embodiment of an acoustic speaker system constructed according to this invention.

FIG. 12 shows a cross-sectional view of acoustic speaker system 200, which is constructed according to the principles of this invention. Acoustic speaker system 200 includes preferably spherical enclosure 210, speaker 220, and acoustic damping material 230. Acoustic damping material 230 includes one type of acoustic damping structure 232 although any number of acoustic damping structures can be used, as described below. Acoustic damping material 230 can be formed from one or more resilient sheets. These sheets can then be deformed into at least one multi-layered structure, such as the elongated structures shown in FIGS. 2–11.

Figure 13:
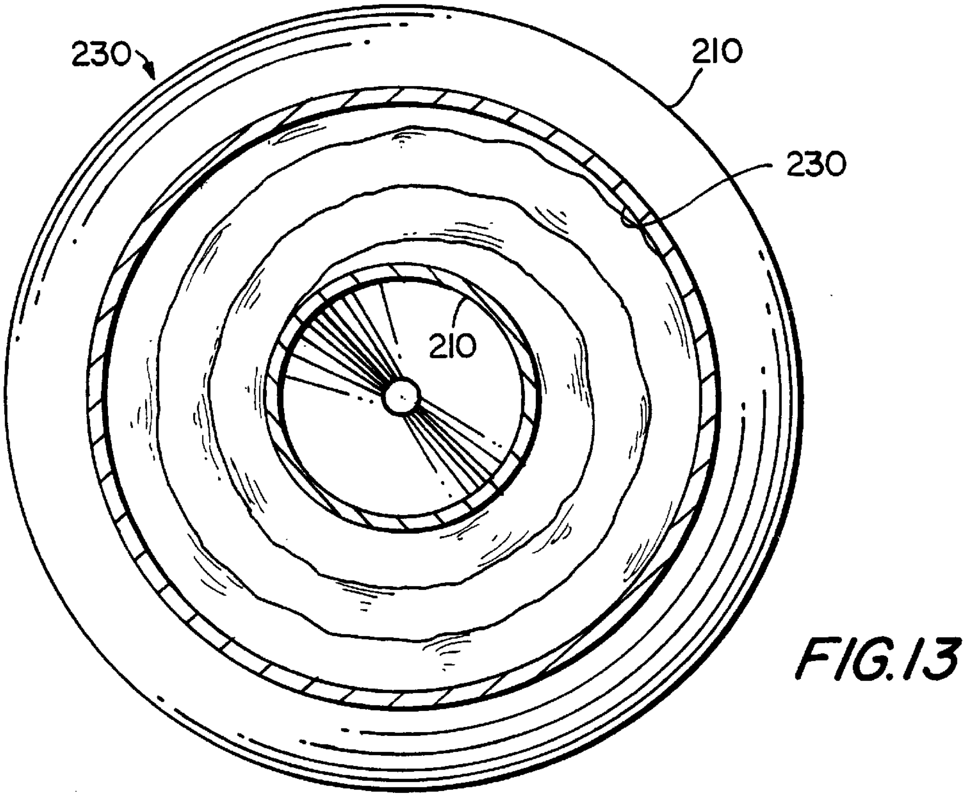
FIG. 13 is a cross-sectional view, taken from line 13—13 of FIG. 12, of the acoustic speaker system of FIG. 12.
Figure 14:
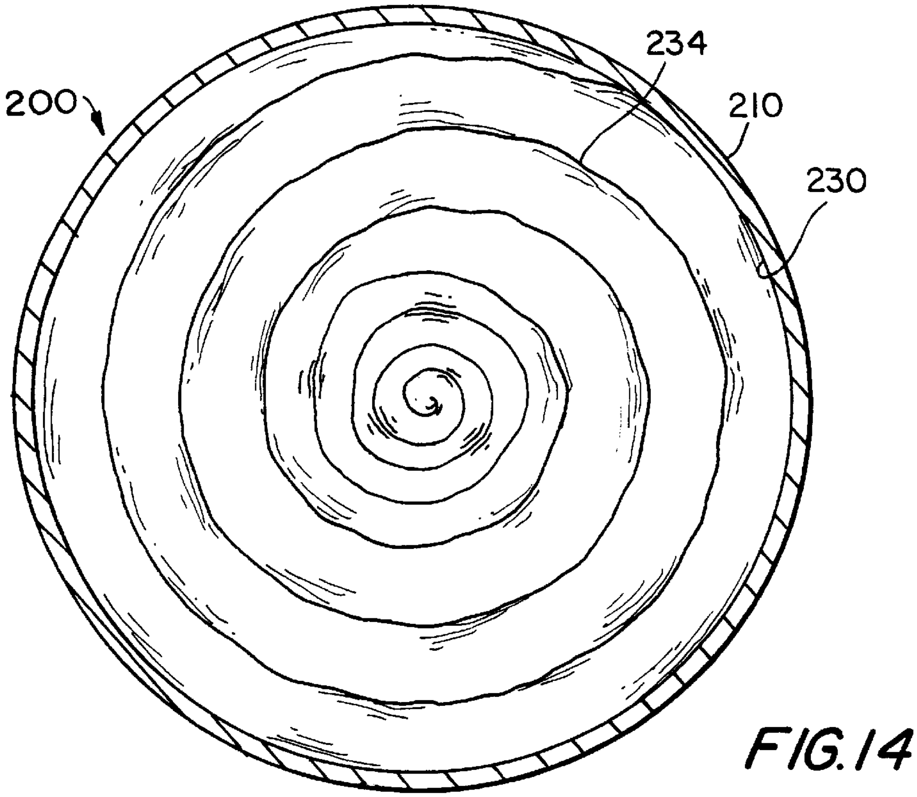
FIG. 14 is a cross-sectional view, taken from line 14—14 of FIG. 12, of the acoustic speaker system of FIGS. 12 and 13.

Acoustic damping material 230, which is inside enclosure 210 and behind acoustic speaker 220, may be placed in enclosure 210 in any way. For example, material 230 may simply be loaded into enclosure 210 with no particular arrangement (not shown), or in any desired arrangement. In a particularly preferred arrangement, material 230 may be wrapped in a spiral fashion as shown in FIGS. 12–14. As shown best in FIG. 12, acoustic damping material 230 can be deformed into a spherical structure having cavity 236, which has surface 237 that substantially conforms to, or adapted to received, rear side 221 of acoustic speaker 220. Thus, when rear side 221 has a conical shape, material 230 can be adapted (e.g., toroidally wrapped) to receive that rear side. Also, enclosure 210 can have other shapes. If enclosure 210 were cubical, for example, acoustic damping material 230 would preferably be deformed to have a substantially cubical shape, but the cavity would still be adapted to received the conical rear side 221 of speaker 220.

TABLES I and II compare the frequency responses of two types of acoustic speaker systems. The first type of system was structurally substantially identical to system 200, but used conventional acoustic damping material (i.e., fiberglass wool). The second type of system was system 200, which used an acoustic damping material according to this invention (i.e., polyethylene film). The acoustic speaker systems included a 12" diameter spherical enclosure and a 6" diameter woofer (effective enclosure volume was about 0.47 $ft^3$). TABLE I lists experimental results obtained using a sealed enclosure and TABLE II lists experimental results obtained using a ported enclosure.

TABLE I

SEALED 12" Spherical Enclosure with 6" Woofer

| Frequency (Hz) | Response (dB) using Fiberglass wool | Response (dB) using Polyethylene film |
|---|---|---|
| 100 | 74 | 74 |
| 90 | 73 | 75 |
| 80 | 69 | 76 |
| 70 | 73 | 77 |
| 60 | 71 | 76 |
| 50 | 65 | 72 |
| 40 | 65 | 72 |
| 30 | 56 | 65 |
| 20 | 48 | 60 |

TABLE II

PORTED 12" Spherical Enclosure with 6" Woofer

| Frequency (Hz) | Response (dB) using Fiberglass wool | Response (dB) using Polyethylene film |
|---|---|---|
| 100 | 74 | 74 |
| 90 | 73 | 73 |
| 80 | 69 | 70 |
| 70 | 74 | 74 |
| 60 | 71 | 72 |
| 50 | 73 | 75 |
| 40 | 78 | 75 |
| 30 | 68 | 72 |
| 20 | 49 | 65 |

Tables I and II reveal that the frequency responses of both the sealed and ported acoustic speaker systems, respectively, are dramatically improved, especially at the low end of the frequency range (i.e., between about 20 Hz and about 50 Hz). And, in the case of the sealed system, the improved frequency response is apparent at even higher frequencies (i.e., up to about 90 Hz). Moreover, while the resonant frequencies of both acoustic systems were identical (i.e., about 57 Hz), the Q values of those resonances in the systems filled with polyethylene film (according to this invention) were substantially reduced.

Other improvements exhibited by the acoustic speaker systems at least partially filled with polyethylene film are not as easily quantifiable. These improvements include better acoustic transparency, clarity, and imaging. It was also noticed that the acoustic damping material of this invention improves electric-acoustic energy conversion efficiency, especially at low electric power levels.

Figure 15:
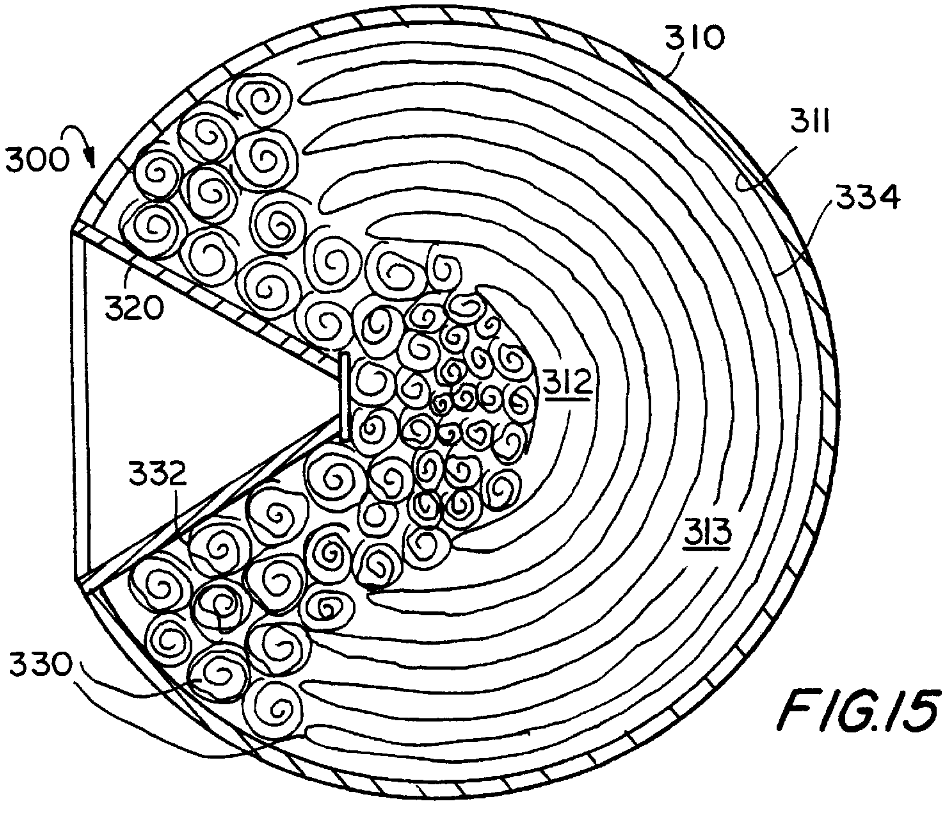
FIG. 15 is a cross-sectional view of a second preferred embodiment of an acoustic speaker system constructed according to this invention.

FIG. 15 shows a cross-sectional view of another acoustic speaker system 300, which can also be constructed according to this invention. Like acoustic speaker system 200, system 300 also includes enclosure 310, speaker 320, and acoustic damping material 330. However, in contrast to acoustic damping material 220, which is used in system 200 (shown in FIG. 12), acoustic damping material 330, which is used in system 300 (shown in FIG. 15), includes two types of acoustic damping structures.

The first type of acoustic damping structure is deformed into coiled (i.e., toroidal) acoustic damping structure 332, which is placed adjacent to and behind speaker 320. Coiled structure 332 is multi-layered and can be made, for example, from one or more of the acoustic damping materials shown in FIGS. 2–11 and described above. Structure 332, as shown in FIG. 15, is made from an elongated roll structure, similar to the one shown in FIGS. 6 and 7. The second type of acoustic damping structure, folded structure 334, preferably fills the remainder of enclosure 310. Structure 334 also is deformed into layers, but the layers of structure 334 are preferably formed by folds in the resilient sheet, similar to structure 110. In both multi-layered structures 332 and 334, a compressible material, such as air, fills the space between layers. The layer density remote from enclosure inner surface 311 (e.g., at point 312) is preferably higher than the layer density adjacent inner surface 311 (e.g., at point 313).

It will be understood that although acoustic speaker system 300 shows only two acoustic damping structures 332 and 334, any number of structures can be used in accordance with this invention. Also, regardless of the number of structures used, the portions of the sheet(s) are preferably, to the greatest extent possible, substantially parallel to, or follow the contours of, enclosure internal surface 311 and/or the rear side of acoustic speaker 320. It should also be understood that the particular arrangements of the damping materials shown in FIGS. 12–15 may be altered as desired.

Enclosure internal surface 311 can have any shape, including substantially ellipsoidal, substantially spherical, substantially cylindrical, substantially polygonal, and any combination thereof, but is preferably substantially spherical.

Figure 16:
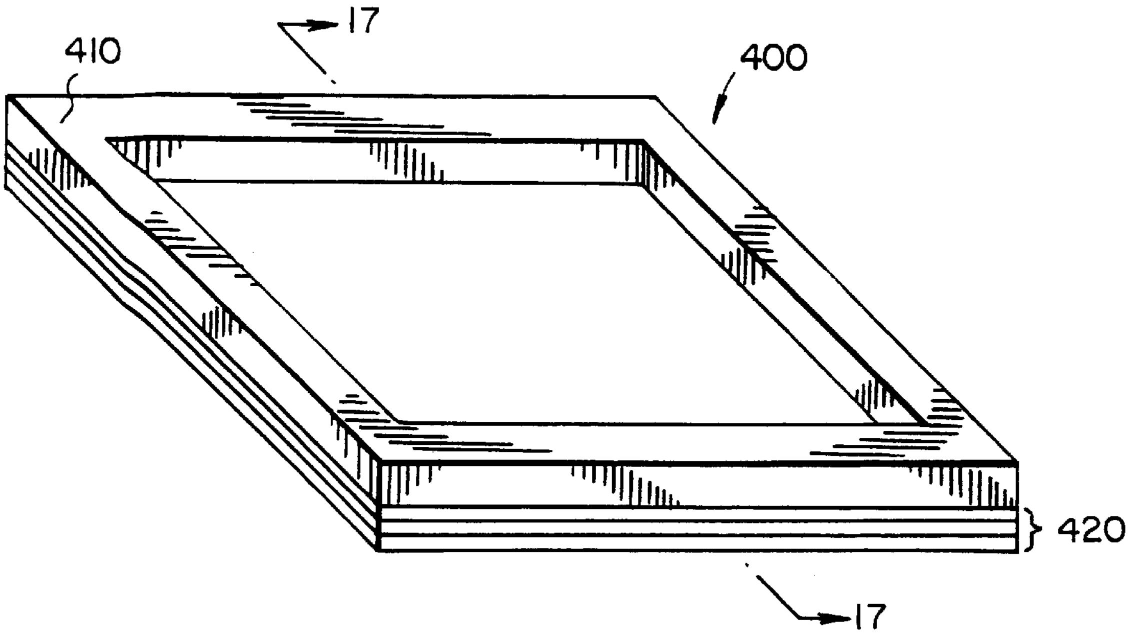
FIG. 16 is a perspective view of a preferred embodiment of a acoustic damping panel constructed according to this invention.
Figure 17:
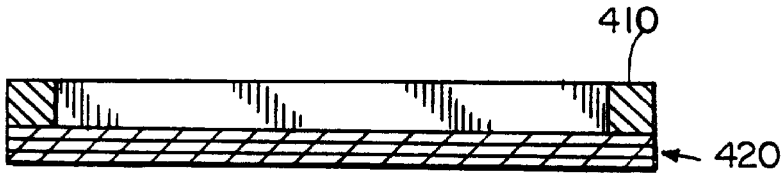
FIG. 17 is a cross-sectional view, taken from line 17—17 of FIG. 16, of the acoustic damping panel of FIG. 16.

In addition to acoustic speaker systems, acoustic damping material according to this invention can be used to make other types of acoustic damping structures, such as acoustic damping panels. Acoustic damping panels can be useful for absorbing sound in substantially enclosed spaces, such as sound recording rooms and areas that are subject to undesirable noise. Acoustic damping panel 400 is shown in FIGS. 16 and 17 and is constructed in accordance with the principles of this invention. Panel 400 includes frame 410 and acoustic damping material 420, which is preferably fixed to frame 410 by any convenient means, such as staples or adhesive. Material 420 is the same acoustic damping material described above with reference to FIGS. 1–11. Therefore, acoustic damping material 420 includes at least one resilient sheet and is arranged in a multi-layered fashion. In another embodiment, the frame used to make the acoustic panel may not be flat. In that case, the surface area of the panel can be increased.

Thus it is seen that a general purpose acoustic damping material has been provided. In addition to being used in acoustic speaker systems and acoustic damping panels, the acoustic damping material can be used wherever an acoustic damping effect is desirable. One skilled in the art will appreciate that this invention can be practiced by other than the desired embodiments, which are presented for purposes of illustration and not of limitation, and this invention is limited only by the claims which follow.

What is claimed is:

1. An acoustic damping material comprising at least one resilient sheet in the form of a film comprising a polyolefin, each of said at least one sheet having a first side and a second side, wherein at least a first portion of one of said first and second sides and a second portion of one of said first and second sides face each other to form a multi-layered structure, wherein said first and second portions are partially separated by a compressible material, thereby substantially trapping pockets of said compressible material between said first and said second portions, and wherein at least some of said pockets are in fluid communication with one another.

2. The acoustic speaker system of claim 1 wherein said sheet has a thickness less than about 5 mils (about 0.13 mm).

3. The acoustic speaker system of claim 2 wherein said sheet has a thickness less than about 1.5 mils (about 0.038 mm).

4. The acoustic damping material of claim 1 wherein said at least one sheet is a laminate.

5. The acoustic damping material of claim 1 wherein said at least one sheet is substantially nonporous to air at about atmospheric pressure.

6. The acoustic damping material of claim 1 wherein said polyolefin comprises polyethylene.

7. The acoustic damping material of claim 1 wherein said at least one sheet is twisted.

8. The acoustic damping material of claim 1 wherein said at least one sheet is folded.

9. The acoustic damping material of claim 1 wherein said at least one sheet is rolled.

10. The acoustic damping material of claim 1 wherein said multi-layered structure has a cavity.

11. The acoustic damping material of claim 10 wherein said cavity has a surface that substantially conforms to a rear side of an acoustic speaker.

12. The acoustic damping material of claim 11 wherein said cavity surface has a substantially conical portion.

13. The acoustic speaker system of claim 1 wherein said compressible material is a gas.

14. The acoustic damping material of claim 1 wherein at least one of said pockets is in fluid communication with atmosphere.

15. An acoustic speaker system comprising:

a system enclosure;

an acoustic speaker mounted to said enclosure; and acoustic damping material inside said enclosure, said material comprising at least one resilient sheet in the form of a film comprising polyolefin, each of said at least one sheet having a first side and a second side, wherein at least a first portion of one of said first and second sides and a second portion of one of said first and second sides face each other to form a multi-layered structure, wherein said first and second portions are partially separated by a compressible material, thereby substantially trapping pockets of said compressible material between said first and second portions, and wherein at least some of said pockets are in fluid communication with one another.

16. The acoustic speaker system of claim 15 wherein said sheet has a thickness less than about 5 mils (about 0.13 mm).

17. The acoustic speaker system of claim 16 wherein said sheet has a thickness less than about 1.5 mils (about 0.038 mm).

18. The acoustic speaker system of claim 15 wherein said at least one sheet is a laminate.

19. The acoustic speaker system of claim 15 wherein said at least one sheet is substantially nonporous to air at about atmospheric pressure.

20. The acoustic speaker system of claim 15 wherein said polyolefin comprises polyethylene.

21. The acoustic speaker system of claim 15 wherein said at least one sheet is twisted.

22. The acoustic speaker system of claim 15 wherein said at least one sheet is folded.

23. The acoustic speaker system of claim 15 wherein said at least one sheet is rolled.

24. The acoustic speaker system of claim 15 wherein said structure has a cavity.

25. The acoustic speaker system of claim 24 wherein said cavity has a surface that substantially conforms to a rear side of said acoustic speaker.

26. The acoustic speaker system of claim 25 wherein said cavity surface has a substantially conical portion.

27. The acoustic speaker system of claim 15 wherein said compressible material is a gas.

28. The acoustic speaker system of claim 15 wherein said enclosure has an internal surface, and wherein at least a portion of said at least one sheet is substantially parallel to at least a portion of said enclosure internal surface.

29. The acoustic speaker system of claim 28 wherein said enclosure internal surface has a shape selected from the group selected from substantially ellipsoidal, substantially spherical, substantially cylindrical, substantially polygonal, and combinations thereof.

30. The acoustic speaker system of claim 15 wherein at least one of said pockets is in fluid communication with atmosphere.

31. For use in making an acoustic speaker system, a method for making acoustic damping material, said method comprising deforming at least one resilient sheet in the form of a film comprising polyolefin, each of said at least one sheet having a first side and a second side, wherein at least a first portion of one of said first and second sides and a second portion of one of said first and second sides face each other to form a multi-layered structure, wherein said first and second portions are partially separated by a compressible material, thereby substantially trapping pockets of said compressible material between said first and second portions, and wherein at least some of said pockets are in fluid communication with one another.

32. The method of claim 31 wherein said deforming comprises deforming by twisting, folding, rolling, and any combination thereof.

33. The method of claim 32 wherein said speaker system comprises an enclosure, said enclosure having an inner surface and said damping material having a layer density, said density near said inner surface being less than said density remote from said inner surface.

34. The method of claim 32 wherein said deforming comprises deforming said at least one sheet so that a cavity is formed therein, said cavity having a surface that substantially conforms a rear side of an acoustic speaker.

35. The method of claim 31 wherein said deforming comprises deforming at least one sheet that has a thickness less than about 5 mils (about 0.13 mm).

36. The method of claim 35 wherein said deforming comprises deforming at least one sheet that has a thickness less than about 1.5 mils (about 0.038 mm).

37. The method of claim 36 wherein said deforming comprises deforming at least one sheet that is substantially nonporous to air at about atmospheric pressure.

38. The method of claim 31 wherein said deforming comprises deforming at least one sheet that comprises a polymer.

39. The method of claim 31 wherein at least one of said pockets is in fluid communication with atmosphere.

40. An acoustic damping panel comprising:

a frame; and acoustic damping material fixed to said frame, said material comprising at least one resilient sheet in the form of a film comprising a polyolefin, each of said at least one sheet having a first side and a second side, wherein at least a first portion of one of said first and second sides and a second portion of one of said first and second sides face each other to form a multi-layered structure, wherein said first and second portions are partially separated by a compressible material, thereby substantially trapping pockets of said compressible material between said first and second portions, and wherein at least some of said pockets are in fluid communication with one another.

41. The acoustic damping panel of claim 40 wherein said sheet has a thickness less than about 5 mils (about 0.13 mm).

42. The acoustic damping panel of claim 40 wherein said sheet has a thickness less than about 1.5 mils (about 0.038 mm).

43. The acoustic damping panel of claim 40 wherein said at least one sheet is substantially nonporous to air at about atmospheric pressure.

44. The acoustic damping panel of claim 40 wherein said polyolefin comprises polyethylene.

45. The acoustic damping panel of claim 40 wherein at least one of said pockets is in fluid communication with atmosphere.

46. An acoustic speaker system comprising:

a system enclosure;

an acoustic speaker mounted to said enclosure; and acoustic damping material loaded inside said enclosure, said material comprising at least one resilient sheet in the form of a film comprising polyolefin.

47. The system of claim 46 wherein each of said at least one sheet has a first side and a second side, and wherein at least a first portion of one of said first and second sides and a second portion of one of said first and second sides face each other to form a multi-layered structure.

48. The system of claim 47 wherein said first and second portions are partially separated by a compressible material, thereby substantially trapping pockets of said compressible material between said first and said second portions, and wherein at least some of said pockets are in fluid communication with one another.

49. The system of claim 46 wherein said sheet has a thickness less than about 5 mils (about 0.13 mm).

50. The system of claim 46 wherein said at least one sheet is a laminate.

51. The system of claim 46 wherein said at least one sheet is substantially nonporous to air at about atmospheric pressure.

52. The system of claim 46 wherein said polyolefin comprises polyethylene.

53. The system of claim 46 wherein said structure has a cavity.

54. The system of claim 53 wherein said cavity has a surface that substantially conforms to a rear side of said acoustic speaker.

55. The system of claim 54 wherein said cavity surface has a substantially conical portion.

56. The acoustic speaker system of claim 46 wherein said sides that face each other are at least partially separated by a compressible material.

57. The acoustic speaker system of claim 46 wherein said enclosure has an internal surface, and wherein at least a portion of said at least one sheet is substantially parallel to at least a portion of said enclosure internal surface.

58. The system of claim 57 wherein said enclosure internal surface has a shape selected from the group selected from substantially ellipsoidal, substantially spherical, substantially cylindrical, substantially polygonal, and combinations thereof.

* * * * *

UNITED STATES PATENT AND TRADEMARK OFFICE

CERTIFICATE OF CORRECTION

PATENT NO. : 6,073,723
DATED : June 13, 2000
INVENTOR(S) : Anthony Gallo

It is certified that error appears in the above-identified patent and that said Letters Patent is hereby corrected as shown below:

Item [56] References Cited, under FOREIGN PATENT DOCUMENTS", "2 372 566 6/1975" should be -- 2 372 566 6/1978 --.

Column 3,
Line 25, "a" should be -- an --.

Column 4,
Line 5, "are" should be -- is --.

Column 5,
Line 9, "portion" should be -- portions --.

Column 6,
Line 39, "232" should be -- 232, --.
Line 64, "received" should be -- receive --.

Column 9,
Line 4, "speaker system" should be -- damping material --.
Line 6, "speaker system" should be -- damping material --.
Line 28, "speaker system" should be -- damping material --.

Signed and Sealed this

Fourteenth Day of August, 2001

*Attest:*

Nicholas P. Godici

NICHOLAS P. GODICI

*Attesting Officer* *Acting Director of the United States Patent and Trademark Office*